United States Patent
Arai et al.

(10) Patent No.: US 10,384,860 B2
(45) Date of Patent: Aug. 20, 2019

(54) CARRIER TAPE FOR ELECTRONIC COMPONENT STORAGE TAPE, ELECTRONIC COMPONENT STORAGE TAPE, AND METHOD FOR MANUFACTURING ELECTRONIC COMPONENT STORAGE TAPE

(71) Applicant: TAIYO YUDEN CO., LTD., Chuo-ku, Tokyo (JP)

(72) Inventors: Takashi Arai, Takasaki (JP); Kageyuki Sekine, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/653,216

(22) Filed: Jul. 18, 2017

(65) Prior Publication Data

US 2018/0029783 A1  Feb. 1, 2018

(30) Foreign Application Priority Data

Jul. 27, 2016 (JP) .................... 2016-146921
May 1, 2017 (JP) .................... 2017-091020

(51) Int. Cl.
  *B65D 85/02* (2006.01)
  *H01L 23/02* (2006.01)
  (Continued)

(52) U.S. Cl.
  CPC ............ *B65D 85/02* (2013.01); *B65B 9/045* (2013.01); *B65B 15/04* (2013.01); *B65D 73/02* (2013.01);
  (Continued)

(58) Field of Classification Search
  CPC ..... B65D 73/02; B65D 75/327; Y10T 428/15; Y10T 428/24479; Y10T 428/14;
  (Continued)

(56) References Cited

U.S. PATENT DOCUMENTS 4,966,281 A * 10/1990 Kawanishi ............ B65D 73/02
                                                        206/460
5,333,733 A *  8/1994 Murata ............... H05K 13/0084
                                                        206/714
(Continued)

FOREIGN PATENT DOCUMENTS

JP    2000-327025   * 11/2000
JP    2002240851 A    8/2002
(Continued)

*Primary Examiner* — Hung Q Dang
(74) *Attorney, Agent, or Firm* — Law Office of Katsuhiro Arai

(57) ABSTRACT

In an embodiment, a carrier tape 10 for storing electronic components includes a band-shaped tape body 11 and storage recesses 12a, each having length L1, width W1, and depth D1 sufficient to store an electronic component EC, which storage recesses are provided in the tape body 11 at equal intervals in the length direction. On one width-direction side of the storage recesses 12a in the tape body 11, guide recesses 12b are provided in such a way that their depth D2 increases from the top face of the tape body 11 toward the one width-direction side face of the storage recess 12b, and that the guide recesses 12b themselves continue to the storage recesses 12a. The carrier tape is suited for the method of inserting electronic components into the storage recesses in the carrier tape from the side.

20 Claims, 4 Drawing Sheets

(51) Int. Cl.
*B65B 15/04* (2006.01)
*H05K 13/02* (2006.01)
*B65D 73/02* (2006.01)
*H05K 13/00* (2006.01)
*B65B 9/04* (2006.01)

(52) U.S. Cl.
CPC ......... *H01L 23/02* (2013.01); *H05K 13/0084* (2013.01); *H05K 13/02* (2013.01)

(58) Field of Classification Search
CPC ........... Y10T 428/28; Y10T 428/24314; Y10T 428/2457; Y10T 428/24612; Y10T 428/24752; Y10T 428/24777; Y10T 156/1064; Y10T 156/1082; Y10T 428/24488; Y10T 428/1495; Y10T 156/1168; Y10T 428/1471; Y10T 156/1066; B65B 15/04; B29C 43/222; B32B 3/30; H05K 13/0084; Y10S 428/906; G11B 23/107
USPC .................................................. 206/713–728
See application file for complete search history.

(56) References Cited

U.S. PATENT DOCUMENTS

| | | | |
|---|---|---|---|
| 7,584,853 B2* | 9/2009 | Yoshii | H05K 13/0084 206/713 |
| 2002/0092794 A1* | 7/2002 | Hong | H01L 21/6835 206/714 |
| 2004/0040886 A1* | 3/2004 | Tellkamp | H05K 13/0084 206/714 |
| 2009/0173660 A1* | 7/2009 | Lee | B65D 73/02 206/713 |
| 2013/0193016 A1* | 8/2013 | Sasamura | H05K 13/0084 206/389 |

FOREIGN PATENT DOCUMENTS

| | | |
|---|---|---|
| JP | 2006160369 A | 6/2006 |
| JP | 2012081997 A | 4/2012 |

* cited by examiner

CARRIER TAPE FOR ELECTRONIC COMPONENT STORAGE TAPE, ELECTRONIC COMPONENT STORAGE TAPE, AND METHOD FOR MANUFACTURING ELECTRONIC COMPONENT STORAGE TAPE

BACKGROUND

Field of the Invention

The present invention relates to a carrier tape for electronic component storage tape, an electronic component storage tape using such carrier tape, and a method for manufacturing such electronic component storage tape.

Description of the Related Art

Conventional carrier tapes for electronic component storage tape are constructed by a band-shaped tape body in which many storage recesses of roughly rectangular solid shape are provided at equal intervals in the length direction, and many feed holes of roughly circular shape are also provided at equal intervals in the length direction (refer to Patent Literatures 1 to 3 below, for example).

Also, insertion of electronic components in the respective storage recesses in the carrier tape is generally implemented in such a way that electronic components of roughly rectangular solid shape that have been aligned by a bowl feeder are supplied one-by-one into an insertion machine via a linear feeder, while the carrier tape is moved intermittently below the insertion machine, and the electronic components that have been supplied into the insertion machine are moved downward when the carrier tape is stopped, and inserted into the storage recesses.

Incidentally, to insert electronic components into the storage recesses in the carrier tape from above, in the manner described above, the two-dimensional positions of the electronic components before insertion must be aligned, in top view, with the two-dimensional positions of the storage recesses in which the electronic components will be inserted. Accordingly, a method of inserting electronic components into the storage recesses in the carrier tape from the side has been examined in recent years, for the purpose of simplifying the control of their mutual positions at the time of insertion.

However, the conventional carrier tapes mentioned earlier are not necessarily suited for the method of inserting electronic components into the storage recesses in the carrier tape from the side, because these tapes are constructed on the assumption that electronic components will be inserted into the storage recesses in the carrier tape from above.

BACKGROUND ART LITERATURES

[Patent Literature 1] Japanese Patent Laid-open No. 2012-081997
[Patent Literature 2] Japanese Patent Laid-open No. 2006-160369
[Patent Literature 3] Japanese Patent Laid-open No. 2002-240851

SUMMARY

An object of the present invention is to provide a carrier tape for electronic component storage tape which is suited for the method of inserting electronic components into the storage recesses in the carrier tape from the side, an electronic component storage tape using such carrier tape, and a method for manufacturing such electronic component storage tape.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, a carrier tape for electronic component storage tape pertaining to the present invention is such that, when the long side and short side of the carrier tape represent the length direction and width direction, respectively, and the direction crossing at right angles with these directions represents the height direction, while the dimension along the length direction represents the length, dimension along the width direction represents the width, and dimension along the height direction represents the height or depth, then the carrier tape comprises a band-shaped tape body, as well as storage recesses, each having sufficient length, width, and depth to store an electronic component, which are provided in the tape body at equal intervals in the length direction, and on one width-direction side of the storage recesses in the tape body, guide recesses are provided in such a way that their depth increases from the top face of the tape body toward the one width-direction side face of the storage recess, and that the guide recesses themselves continue to the storage recesses.

Additionally, an electronic component storage tape pertaining to the present invention comprises: the aforementioned carrier tape; electronic components that have been inserted into the storage recesses in the carrier tape; and a cover tape that partially covers the top face of the carrier tape in a manner blocking off the top openings of the storage recesses in which the electronic components are stored.

Furthermore, a method for manufacturing electronic component storage tape pertaining to the present invention comprises: a step to prepare the aforementioned carrier tape; a step to insert electronic components into the storage recesses in the carrier tape; and a step to partially cover the top face of the carrier tape with a cover tape in a manner blocking off the top openings of the storage recesses in which the electronic components are stored.

According to the present invention, a carrier tape for electronic component storage tape which is suited for the method of inserting electronic components into the storage recesses in the carrier tape from the side, an electronic component storage tape using such carrier tape, and a method for manufacturing such electronic component storage tape, can be provided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS 10, 10-1, 10-2—Carrier tape, 11—Tape body, 11a—One width-direction edge, 11b—Other width-direction edge, 12—Component storage part, 12a—Storage recess, 12a1—Bottom face, 12a2—Side face, W1—Width of the storage recess, L1—Length of the storage recess, D1—Depth of the storage recess, 12b—Guide recess, 12b1—Bottom face, 12b2—Side face, W2—Width of the guide recess, L2—Length of the guide recess, D2—Depth of the guide recess, 20—Cover tape, 30—Electronic component storage tape.

DETAILED DESCRIPTION OF EMBODIMENTS

In the following explanations, the long side (lateral direction in FIG. 1) and short side (vertical direction in FIG. 1) of the carrier tape 10 mentioned below represent the length direction and width direction, respectively, and the direction crossing at right angles with these directions (vertical direction in FIG. 2) represents the height direction, while the dimension along the length direction represents the length, dimension along the width direction represents the width, and dimension along the height direction represents the height or depth, for the sake of convenience.

First Embodiment

Figure 1:
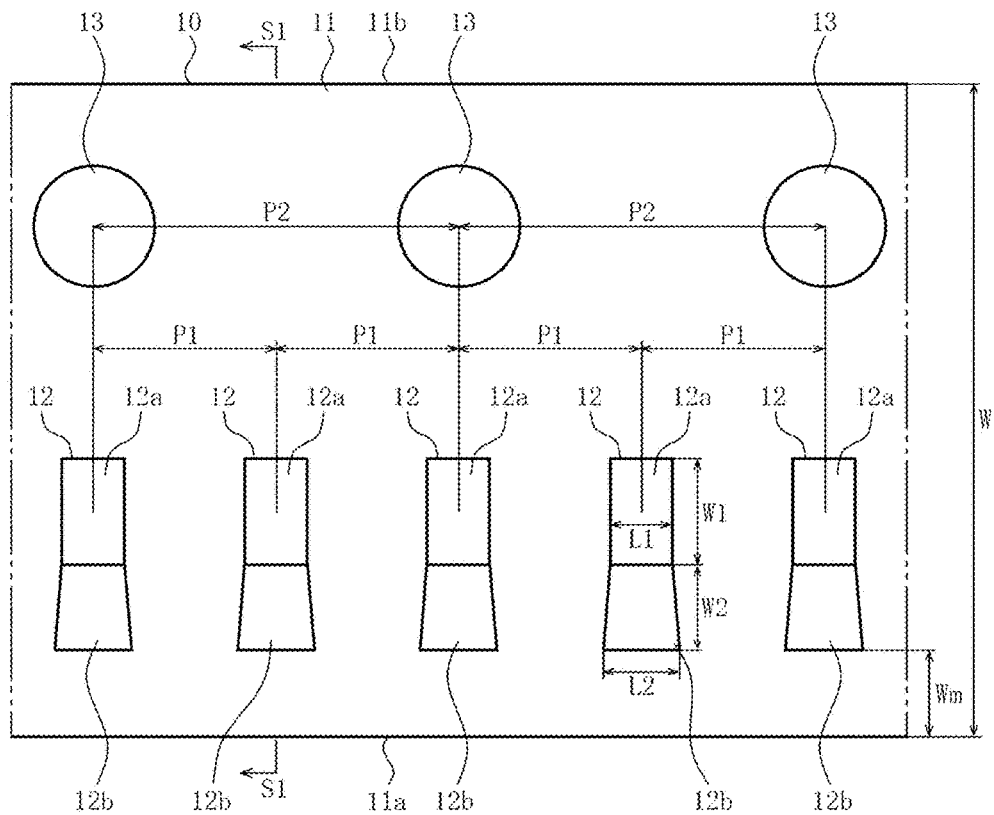
FIG. 1 is a partial top view of a carrier tape pertaining to the first embodiment of the present invention.
Figure 2:
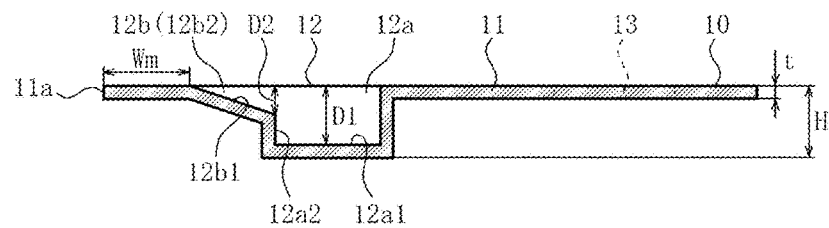
FIG. 2 is a cross-sectional view of FIG. 1 along line S1-S1.

FIGS. 1 and 2 show a carrier tape 10 pertaining to the first embodiment of the present invention.

The carrier tape 10 shown in FIGS. 1 and 2 is an embossed tape made of polystyrene, polycarbonate, polyethylene terephthalate, polypropylene, etc., for example. The embossing method is not limited in any way, and pneumatic forming, press forming, vacuum rotary forming (vacuum drum forming), etc., may be adopted as deemed appropriate.

The carrier tape 10 has: (1) a band-shaped tape body 11 having width W; (2) many component storage parts 12 provided at equal intervals (pitch P1) in the length direction at positions near one width-direction edge 11a of the tape body 11; and (3) many feed holes 13 of roughly circular shape, provided at equal intervals (pitch P2) in the length direction at positions near the other width-direction edge 11b of the tape body 11. The height H of the carrier tape 10 corresponds to the depth D1 of a storage recess 12a mentioned below, plus the thickness t of the tape body 11. It should be noted that, while the width W and thickness t of the tape body 11 are not limited in any way, in one example the thickness t is generally in a range of 0.15 to 0.4 mm when the width W is 8 mm.

Also, a margin (not accompanied by symbol) of width Wm exists between one width-direction edge (bottom edge in FIG. 1) of each component storage part 12 in the carrier tape 10 and one width-direction edge 11a of the tape body 11. This margin represents an area used when a cover tape 20 (refer to FIG. 4) is attached to the top face of the tape body 11.

Each component storage part 12 is constituted by a storage recess 12a and a guide recess 12b provided on one width-direction side of this storage recess 12a.

Figure 3A:
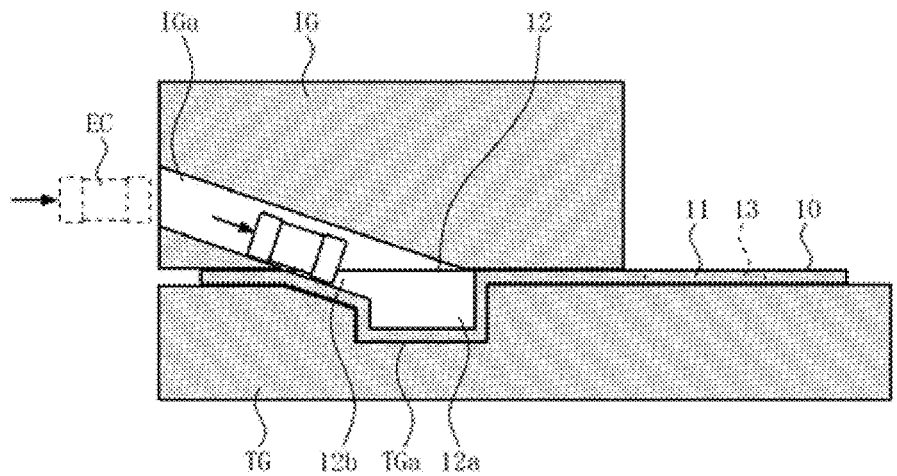
FIGS. 3A to 3C are drawings showing an example of how an electronic component is inserted into a storage recess in the carrier tape shown in FIGS. 1 and 2, from the side.
Figure 3B:
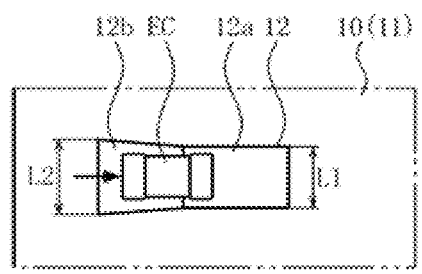
Figure 3C:
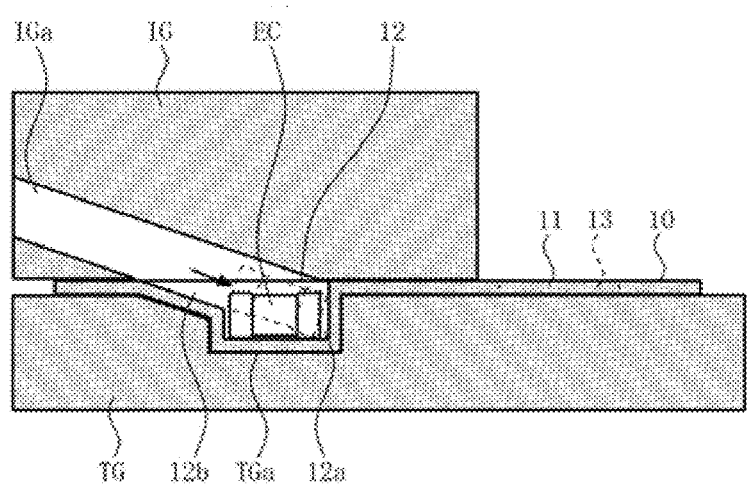
Figure 4:
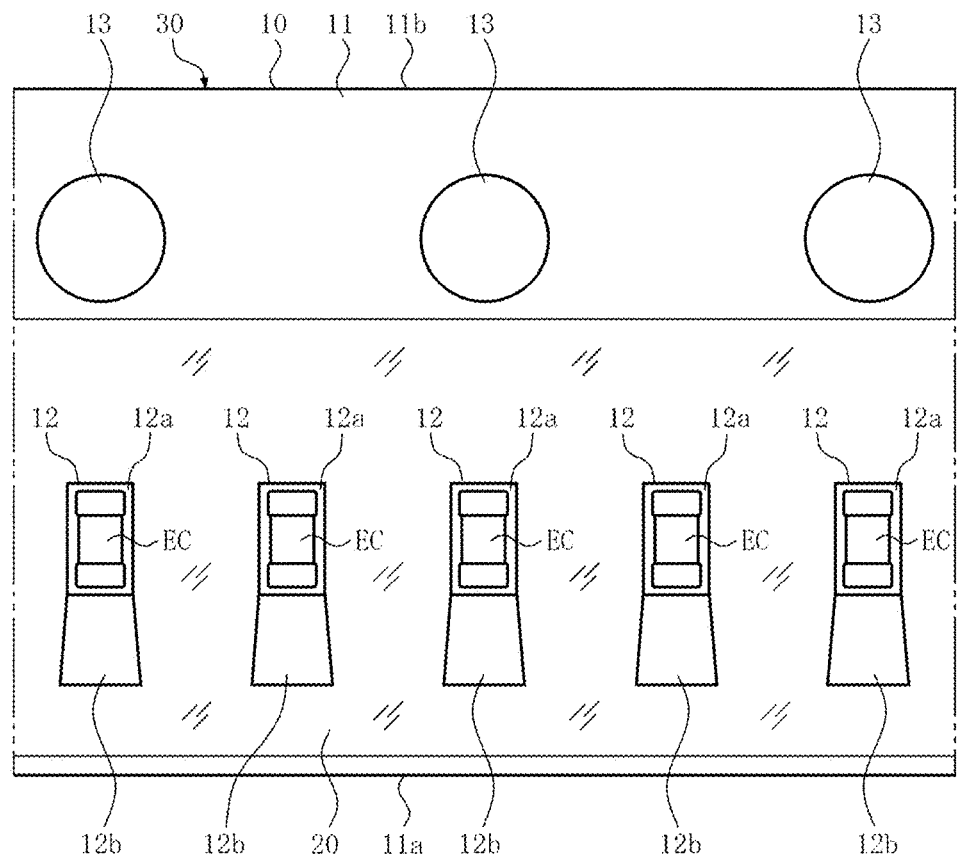
FIG. 4 is a partial top view of an electronic component storage tape that uses the carrier tape shown in FIGS. 1 and 2.

The storage recess 12a is shaped roughly as a rectangular solid of sufficient length L1, width W1, and depth D1 to store an electronic component EC (refer to FIGS. 3A to 4). This storage recess 12a is constituted by a bottom face 12a1 and four side faces 12a2 (including two side faces opposing each other in the width direction, and two side faces opposing each other in the length direction). Although not apparent in FIGS. 1 and 2, the actual four side faces 12a2 are each inclined by approx. 0.2 to 10 degrees corresponding to the draft angle for embossing. It should be noted that the electronic component EC is of roughly rectangular solid shape, having a first dimension (not accompanied by symbol) corresponding to the length L1 of the storage recess 12a, a second dimension (not accompanied by symbol) corresponding to the width W1 of the storage recess 12a, and a third dimension (not accompanied by symbol) corresponding to the depth D1 of the storage recess 12a.

The width W1 of the storage recess 12a is slightly larger than the first dimension of the electronic component EC, the length L1 of the storage recess 12a is slightly larger than the second dimension of the electronic component EC, and the depth D1 of the storage recess 12a is slightly larger than the third dimension of the electronic component EC. Also, the height of one width-direction side face on the guide recess 12b side (left side face in FIG. 2), among the four side faces 12a2 of the storage recess 12a, corresponds to the depth D1 minus the maximum value of the depth D2 of the guide recess 12b.

The guide recess 12b is shaped roughly as a pentahedron, and represents a part that guides the electronic component EC into the storage recess 12a. This guide recess 12b is constituted by a bottom face 12b1 and two side faces 12b2 (two side faces opposing each other in the length direction). Although not apparent in FIGS. 1 and 2, the actual two side faces 12b2 are each inclined by approx. 0.2 to 10 degrees corresponding to the draft angle for embossing.

As is evident from FIGS. 1 and 2, the guide recess 12b is formed in such a way that its depth D2 increases from the top face of the tape body 11 toward one width-direction side face (left side face in FIG. 2) among the four side faces 12a2 of the storage recess 12a, and that the guide recess 12b itself continues to the storage recess 12a, while its length L2 decreases from the top face of the tape body 11 toward one width-direction side face (left side face in FIG. 2) of the storage recess 12a.

While the width W2 of the guide recess 12b is not limited in any way, preferably the width W2 is set by considering the maximum value of the depth D2 of the storage recess 12a, so that the inclination angle of the bottom face 12b1 falls within a range of 15 to 30 degrees. Also, the minimum value of the length L2 of the guide recess 12b is matched with the length L1 of the storage recess 12a. While the maximum value of the length L2 only needs to be greater than the second dimension of the electronic component EC, preferably it is set in a range of 1.1 to 1.5 times the second dimension of the electronic component EC. Furthermore, while the maximum value of the depth D2 of the guide recess 12b only needs to be smaller than the depth D1 of the storage recess 12a, preferably it is set in a range of one-quarter to three-quarters of the third dimension of the electronic component EC.

FIGS. 3A to 3C show an example of how the electronic component EC is inserted into the storage recess 12a in the carrier tape 10 shown in FIGS. 1 and 2, from the side. This insertion method is only one example and does not in any way limit how the electronic component EC can be inserted into the storage recess 12a in the carrier tape 10 from the side.

In FIGS. 3A to 3C, TG denotes a tape guide, TGa denotes a guide groove, IG denotes a component guide, and IGa denotes a component passage. The top face of the tape guide TG supports the bottom face of the carrier tape 10 except for the storage recess 12a and guide recess 12b, while the interior face of the guide groove TGa supports the bottom face of the storage recess 12a and that of the guide recess 12b. On the other hand, the bottom face of the component guide IG opposes the top face of the carrier tape 10 by leaving just enough clearance in between to not obstruct the intermittent movement of the carrier tape 10 in the length direction, but to suppress the displacement of the carrier tape 10 in the vertical direction. In addition, the lateral cross-section shape of the component passage IGa is a rectangle which is slightly larger than the second dimension and third dimension of the electronic component EC, and it also has an inclination appropriate for the inclination angle of the bottom face 12b1 of the guide recess 12b.

As shown in FIG. 3A, when inserting the electronic component EC into the storage recess 12a in the carrier tape 10 from the side, the electronic component EC, which has been aligned by a bowl feeder (not illustrated), is fed into the component passage IGa via a linear feeder (not illustrated). The electronic component EC that has been fed into the component passage IGa slides according to the inclination of the component passage IGa, to be fed into the guide recess 12b. Then, as shown in FIG. 3B, the electronic component EC that has been fed into the guide recess 12b slides according to the inclination of the bottom face 12b1, to be fed into the storage recess 12a.

As described earlier, the guide recess 12b is formed in such a way that its length L2 decreases from the top face of the tape body 11 toward one width-direction side face (left side face in FIG. 3B) of the storage recess 12a, so even when the position of the electronic component EC is disturbed immediately after it has been fed into the guide recess 12b, such disturbed position is corrected during the course of movement of the electronic component EC in the guide recess 12b. Also, because the minimum value of the length L2 of the guide recess 12b is matched with the length L1 of the storage recess 12a, the electronic component EC is smoothly fed into the storage recess 12a from the guide recess 12b after its position has been corrected.

As shown in FIG. 3C, when the apical end of the electronic component EC that has been fed into the storage recess 12a contacts the other width-direction side face (right side face in FIG. 3C) of the storage recess 12a, its bottom face inclines in a manner contacting the bottom face 12a1 of the storage recess 12a, and the electronic component EC is inserted into the storage recess 12a as a result. The maximum value of the depth D2 of the guide recess 12b is smaller than the depth D1 of the storage recess 12a, so even when the electronic component EC vibrates due to external force after it has been inserted in the storage recess 12a, problems such as the electronic component EC partially entering the guide recess 12b and its storage position being disturbed significantly as a result, will not occur.

It should be noted that, if the electronic component EC does not slide smoothly in the guide recess 12b or the electronic component EC is not fed smoothly into the storage recess 12a from the guide recess 12b, because the electronic component EC has a small mass or small size, or the like, then all that is needed is to apply negative pressure to the component passage IGa through the clearance between the bottom face of the component guide IG where the component passage IGa does not exist (area on the right side in FIG. 3A) and the top face of the carrier tape 10, or through a suction passage provided separately in the aforementioned area of the component guide IG, and use this negative pressure to pull the electronic component EC in the component passage IGa into the guide recess 12b and storage recess 12a.

As described earlier, the guide recess 12b is provided on one width-direction side of the storage recess 12a in such a way that its depth D2 increases from the top face of the tape body 11 toward one width-direction side face of the storage recess 12a, and that the guide recess 12b itself continues to the storage recess 12a, and therefore this guide recess 12b can be used to properly implement the method of inserting the electronic component EC into the storage recess 12a in the carrier tape 10 from the side.

Additionally, the maximum value of the depth D2 of the guide recess 12b is smaller than the depth D1 of the storage recess 12a, so even when the electronic component EC vibrates due to external force after it has been inserted in the storage recess 12a, problems such as the electronic component EC partially entering the guide recess 12b and its storage position being disturbed significantly as a result, will not occur.

Furthermore, the guide recess 12b is formed in such a way that its length L2 decreases from the top face of the tape body 11 toward one width-direction side face of the storage recess 12a, so even when the position of the electronic component EC is disturbed immediately after it has been fed into the guide recess 12b, such disturbed position is corrected during the course of movement of the electronic component EC in the guide recess 12b. Also, because the minimum value of the length L2 of the guide recess 12b is matched with the length L1 of the storage recess 12a, the electronic component EC can be smoothly fed into the storage recess 12a from the guide recess 12b after its position has been corrected.

FIG. 4 shows an electronic component storage tape 30 that uses the carrier tape 10 shown in FIGS. 1 and 2.

The electronic component storage tape 30 shown in FIG. 4 has electronic components EC stored in the respective storage recesses 12a in the carrier tape 10, and the top face of the carrier tape 10 is partially covered with a band-shaped cover tape 20 in a manner blocking off the top openings of the respective storage recesses 12a in which the electronic components EC are stored. In other words, this electronic component storage tape 30 is manufactured by storing electronic components EC in the respective storage recesses 12a in the carrier tape 10, and then partially covering the top face of the carrier tape 10 in a manner blocking off the top openings of the respective storage recesses 12a in which the electronic components EC are stored.

Preferably the cover tape 20 is clear or translucent so that the storage condition can be checked from the outside. Also, the cover tape 20 may be either a thermos-sensitive type or pressure-sensitive type, and it attaches to the top face of the tape body 11 at least on both sides in the width direction. In other words, by using the carrier tape 10 shown in FIGS. 1 and 2, the electronic component storage tape 30 shown in FIG. 4 can be manufactured in a precise manner.

Second Embodiment

Figure 5:
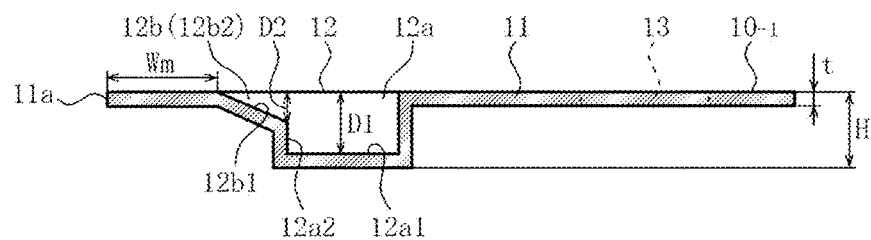
FIG. 5 is a drawing corresponding to FIG. 2, of a carrier tape pertaining to the second embodiment of the present invention.

FIG. 5 shows a carrier tape 10-1 pertaining to the second embodiment of the present invention.

The carrier tape 10-1 shown in FIG. 5 is different from the carrier tape 10 shown in FIGS. 1 and 2, in that the width W2 of the guide recess 12b has been decreased and the inclination angle of the bottom face 12b1 has been increased, and in that the width Wm of the margin (not accompanied by symbol) is larger due to the decrease in the width W2 of the guide recess 12b. The remainder of the constitution is the same as with the carrier tape 10 shown in FIGS. 1 and 2, and thereby not explained.

This carrier tape 10-1 also allows the method of inserting the electronic component EC into the storage recess 12a from the side to be implemented in an appropriate manner, just like the carrier tape 10 shown in FIGS. 1 and 2 does, while it also allows an electronic component storage tape similar to the electronic component storage tape 30 shown in FIG. 4 to be manufactured in a precise manner.

Figure 6:
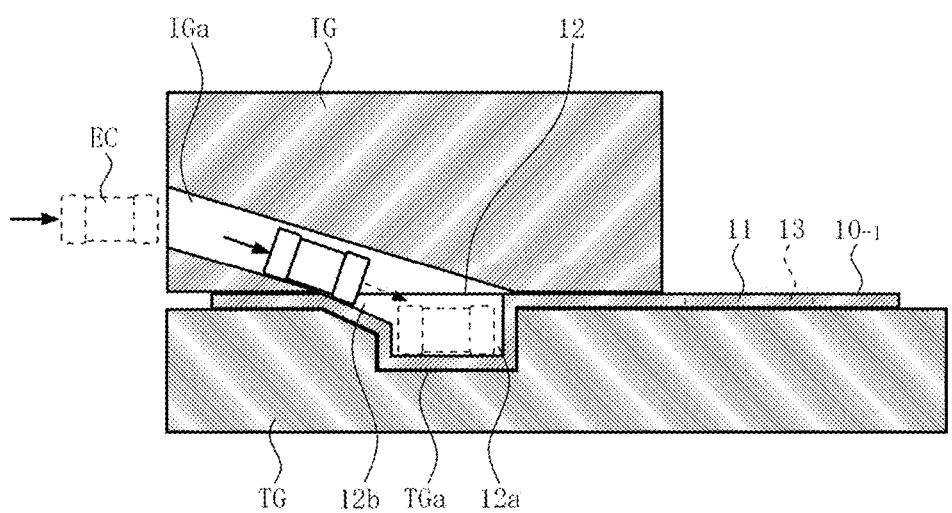
FIG. 6 is a drawing showing an example of how an electronic component is inserted into a storage recess in the carrier tape shown in FIG. 5, from the side.

With the carrier tape 10-1 shown in FIG. 5, the inclination angle of the bottom face 12b1 of the guide recess 12b is greater compared to the carrier tape 10 shown in FIGS. 1 and 2, and this means that, if the inclination of the component passage IGa is the same as the inclination of the component passage IGa shown in FIGS. 3A to 3C, the inclination of the bottom face 12b1 of the guide recess 12b becomes greater than the inclination of the component passage IGa, while at the same time the lateral cross-section shape on the exit side (where the bottom face 12b1 of the guide recess 12b exists) becomes larger than the lateral cross-section shape on the entry side, of the component passage IGa, as shown in FIG. 6. As a result, feeding of the electronic component EC into the guide recess 12b from the component passage IGa, as well as feeding of the electronic component EC into the storage recess 12a from the guide recess 12b, can be performed smoothly.

It should be noted that, also with the carrier tape 10-1 shown in FIG. 5, if the electronic component EC does not slide smoothly in the guide recess 12b or the electronic component EC is not fed smoothly into the storage recess 12a from the guide recess 12b, because the electronic component EC has a small mass or small size, or the like, then all that is needed is to apply negative pressure to the component passage IGa through the clearance between the bottom face of the component guide IG where the component passage IGa does not exist (area on the right side in FIG. 6) and the top face of the carrier tape 10, or through a suction passage provided separately in the aforementioned area of the component guide IG, and use this negative pressure to pull the electronic component EC in the component passage IGa into the guide recess 12b and storage recess 12a.

Third Embodiment

Figure 7:
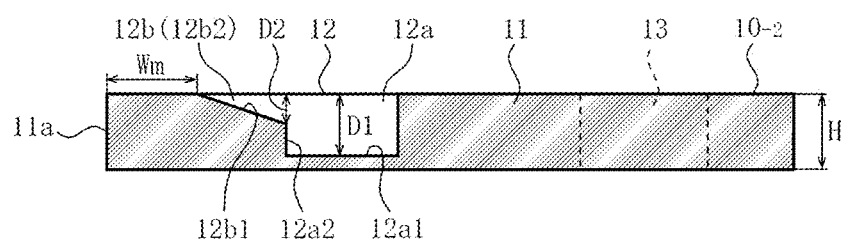
FIG. 7 is a drawing corresponding to FIG. 2, of a carrier tape pertaining to the third embodiment of the present invention.

FIG. 7 shows a carrier tape 10-2 pertaining to the third embodiment of the present invention.

The carrier tape 10-2 shown in FIG. 7 is different from the carrier tape 10 shown in FIGS. 1 and 2, in that the carrier tape 10-2 itself is compression-formed. This carrier tape 10-2 is made of paper, synthetic paper, etc., for example, and the storage recess 12a and guide recess 12b are formed by compression forming, which means that the height H of the carrier tape 10-2 is roughly constant in the width direction. The remainder of the constitution is the same as with the carrier tape 10 shown in FIGS. 1 and 2, and thereby not explained.

This carrier tape 10-2 also allows the method of inserting the electronic component EC into the storage recess 12a from the side to be implemented in an appropriate manner, just like the carrier tape 10 shown in FIGS. 1 and 2 does, while it also allows an electronic component storage tape similar to the electronic component storage tape 30 shown in FIG. 4 to be manufactured in a precise manner.

Other Embodiments (m1) In each of the aforementioned embodiments, the storage recess 12a of the component storage part 12 corresponds to an electronic component EC of roughly rectangular solid shape having the relationship of "First dimension>Second dimension=Third dimension": by changing the depth D1 of the storage recess 12a, however, an electronic component of roughly rectangular solid shape having the relationship of "First dimension>Second dimension>Third dimension," or an electronic component of roughly rectangular solid shape having the relationship of "First dimension>Third dimension>Second dimension," can be inserted (stored). Even when the depth D1 of the storage recess 12a is changed, the method of inserting the electronic component EC into the storage recess 12a from the side can be implemented in an appropriate manner, and also an electronic component storage tape similar to the electronic component storage tape 30 shown in FIG. 4 can be manufactured in a precise manner.

(m2) In each of the aforementioned embodiments, the intervals at which the component storage parts 12 are arranged (pitch P1, refer to FIG. 1) are one half the intervals at which the feed holes 13 are arranged (pitch P2, refer to FIG. 1); however, the pitches P1 and P2 may be changed according to the size of the electronic component to be inserted (stored). Even when the pitches P1 and P2 are changed, the method of inserting the electronic component EC into the storage recess 12a from the side can be implemented in an appropriate manner, and also an electronic component storage tape similar to the electronic component storage tape 30 shown in FIG. 4 can be manufactured in a precise manner.

(m3) In each of the aforementioned embodiments, the guide recess 12b of the component storage part 12 has its bottom face 12b1 formed by a flat surface; even when the bottom face 12b1 is changed to a gradually curved surface (outwardly curved surface, inwardly curved surface, etc.) having a similar inclination, however, the method of inserting the electronic component EC into the storage recess 12a from the side can be implemented in an appropriate manner, and also an electronic component storage tape similar to the electronic component storage tape 30 shown in FIG. 4 can be manufactured in a precise manner.

(m4) In each of the aforementioned embodiments, the guide recess 12b of the component storage part 12 is formed in such a way that its length L2 decreases from the top face of the tape body 11 toward one width-direction side face of the storage recess 12a; however, the length L2 of the guide recess 12*b* may be constant and this length L2 may also is matched with the length L1 of the storage recess 12*a*. In this case, although the position-correction effect of the guide recess 12*b* becomes difficult to achieve, the method of inserting the electronic component EC into the storage recess 12*a* from the side can be implemented in an appropriate manner, and also an electronic component storage tape similar to the electronic component storage tape 30 shown in FIG. 4 can be manufactured in a precise manner.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2016-146921, filed Jul. 27, 2016, and No. 2017-091020, filed May 1, 2017, the disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A carrier tape for electronic component storage tape, wherein:
   when a long side and a short side of the carrier tape represent a length direction and a width direction, respectively, and a direction crossing at right angles with these directions represents a height direction, and a dimension along the length direction represents a length, a dimension along the width direction represents a width, and a dimension along the height direction represents a height or depth;
   the carrier tape comprises a band-shaped tape body and multiple storage recesses formed in the band-shaped tape body, each storage recess having a length, width, and depth sufficient to store an electronic component fully inside the storage recess, which storage recesses are provided in the tape body at equal intervals in the length direction; and
   among one length-direction side, another length-direction side, one width-direction side, and another width-direction side of each storage recess in the tape body, only on the one width-direction side of each storage recess in the tape body, a tapered guide recess is provided, which tapered guide recess has a depth increasing from a top face of the tape body at a distal end of the guide recess toward a proximal end of the guide recess with reference to the storage recess and is continuously connected to the storage recess.

2. A carrier tape for electronic component storage tape according to claim 1, wherein a maximum depth of the guide recess is smaller than a depth of the storage recess.

3. A carrier tape for electronic component storage tape according to claim 2, wherein:
   the electronic component has a first dimension corresponding to a width of the storage recess, a second dimension corresponding to a length of the storage recess, and a third dimension corresponding to a depth of the storage recess; and
   a maximum depth of the guide recess is set in a range of one-quarter to three-quarters of the third dimension of the electronic component.

4. A carrier tape for electronic component storage tape according to claim 2, wherein the guide recess is formed in such a way that its length decreases from a top face of the tape body at the distal end toward the one width-direction side of the storage recess.

5. An electronic component storage tape, comprising:
   a carrier tape according to claim 2;
   the electronic components that have been inserted into the storage recesses in the carrier tape; and
   a cover tape that partially covers a top face of the carrier tape in a manner blocking off top openings of the storage recesses in which the electronic components are stored.

6. A method for manufacturing electronic component storage tape, comprising:
   a step to prepare a carrier tape according to claim 2;
   a step to insert the electronic components into the storage recesses in the carrier tape; and
   a step to partially cover a top face of the carrier tape with a cover tape in a manner blocking off top openings of the storage recesses in which the electronic components are stored.

7. A carrier tape for electronic component storage tape according to claim 1, wherein:
   the electronic component has a first dimension corresponding to a width of the storage recess, a second dimension corresponding to a length of the storage recess, and a third dimension corresponding to a depth of the storage recess; and
   a maximum depth of the guide recess is set in a range of one-quarter to three-quarters of the third dimension of the electronic component.

8. A carrier tape for electronic component storage tape according to claim 7, wherein the guide recess is formed in such a way that its length decreases from a top face of the tape body at the distal end toward the one width-direction side of the storage recess.

9. An electronic component storage tape, comprising:
   a carrier tape according to claim 7;
   the electronic components that have been inserted into the storage recesses in the carrier tape; and
   a cover tape that partially covers a top face of the carrier tape in a manner blocking off top openings of the storage recesses in which the electronic components are stored.

10. A method for manufacturing electronic component storage tape, comprising:
    a step to prepare a carrier tape according to claim 7;
    a step to insert the electronic components into the storage recesses in the carrier tape; and a step to partially cover a top face of the carrier tape with a cover tape in a manner blocking off top openings of the storage recesses in which the electronic components are stored.

11. A carrier tape for electronic component storage tape according to claim 1, wherein the guide recess is formed in such a way that its length decreases from a top face of the tape body at the distal end toward the one width-direction side of the storage recess.

12. A carrier tape for electronic component storage tape according to claim 11, wherein:
the electronic component has a first dimension corresponding to a width of the storage recess, a second dimension corresponding to a length of the storage recess, and a third dimension corresponding to a depth of the storage recess; and
a maximum length of the guide recess is set in a range of 1.1 to 1.5 times the second dimension of the electronic component.

13. A carrier tape for electronic component storage tape according to claim 12, wherein a minimum length of the guide recess agrees with the length of the storage recess.

14. An electronic component storage tape, comprising:
a carrier tape according to claim 12;
the electronic components that have been inserted into the storage recesses in the carrier tape; and
a cover tape that partially covers a top face of the carrier tape in a manner blocking off top openings of the storage recesses in which the electronic components are stored.

15. A carrier tape for electronic component storage tape according to claim 11, wherein a minimum length of the guide recess agrees with the length of the storage recess.

16. An electronic component storage tape, comprising:
a carrier tape according to claim 11;
the electronic components that have been inserted into the storage recesses in the carrier tape; and
a cover tape that partially covers a top face of the carrier tape in a manner blocking off top openings of the storage recesses in which the electronic components are stored.

17. A method for manufacturing electronic component storage tape, comprising:
a step to prepare a carrier tape according to claim 11;
a step to insert the electronic components into the storage recesses in the carrier tape; and
a step to partially cover a top face of the carrier tape with a cover tape in a manner blocking off top openings of the storage recesses in which the electronic components are stored.

18. An electronic component storage tape, comprising:
a carrier tape according to claim 1;
the electronic components that have been inserted into the storage recesses in the carrier tape; and
a cover tape that partially covers a top face of the carrier tape in a manner blocking off top openings of the storage recesses in which the electronic components are stored.

19. An electronic component storage tape, comprising:
a carrier tape according to claim 1;
the electronic components that have been inserted into the storage recesses in the carrier tape; and
a cover tape that partially covers a top face of the carrier tape in a manner blocking off top openings of the storage recesses in which the electronic components are stored.

20. A method for manufacturing electronic component storage tape, comprising:
a step to prepare a carrier tape according to claim 1;
a step to insert the electronic components into the storage recesses in the carrier tape; and
a step to partially cover a top face of the carrier tape with a cover tape in a manner blocking off top openings of the storage recesses in which the electronic components are stored.

* * * * *